(12) United States Patent
Shekhar et al.

(10) Patent No.: US 10,972,001 B2
(45) Date of Patent: Apr. 6, 2021

(54) MULTI-TERMINAL INDUCTORS FOR VOLTAGE REGULATORS

(71) Applicant: Intel Corporation, Santa Clara, CA (US)

(72) Inventors: Sameer Shekhar, Portland, OR (US); Amit K. Jain, Portland, OR (US); Ravi Sankar Vunnam, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/102,203

(22) Filed: Aug. 13, 2018

(65) Prior Publication Data

US 2020/0052583 A1     Feb. 13, 2020

(51) Int. Cl.
| | |
|---|---|
| *H02M 3/158* | (2006.01) |
| *H02M 3/07* | (2006.01) |
| *H01L 23/64* | (2006.01) |
| *H02M 7/00* | (2006.01) |
| *H01L 23/50* | (2006.01) |
| *H01F 17/00* | (2006.01) |
| *H02M 1/00* | (2006.01) |

(52) U.S. Cl.
CPC .............. *H02M 3/07* (2013.01); *H01L 23/50* (2013.01); *H01L 23/645* (2013.01); *H02M 3/158* (2013.01); *H02M 7/003* (2013.01); *H01F 2017/0086* (2013.01); *H02M 2001/0009* (2013.01); *H02M 2003/072* (2013.01)

(58) Field of Classification Search
CPC ................... H02M 3/07; H02M 7/003; H02M 2001/0009; H02M 2003/072; H01L 23/50; H01L 23/645; H01F 2017/0086
See application file for complete search history.

(56) References Cited

U.S. PATENT DOCUMENTS

| | | | |
|---|---|---|---|
| 6,429,632 B1 | 8/2002 | Forbes et al. | |
| 7,596,006 B1 | 9/2009 | Granat | |
| 9,276,477 B2 | 3/2016 | Thomas et al. | |
| 2002/0095775 A1 | 7/2002 | Ahn et al. | |
| 2007/0139151 A1* | 6/2007 | Nussbaum | .......... H01F 17/0013 336/200 |

(Continued)

OTHER PUBLICATIONS

C. Yeh and Y. Lai, "Novel hybrid control technique with constant on/off time control for DC/DC converter to reduce the switching losses," 2009 International Conference on Power Electronics and Drive Systems (PEDS), (Year: 2009).*

(Continued)

*Primary Examiner* — Kyle J Moody
*Assistant Examiner* — Jye-June Lee
(74) *Attorney, Agent, or Firm* — Schwegman Lundberg & Woessner, P.A.

(57) ABSTRACT

Some embodiments include apparatuses having a switching circuit included in a buck converter; an output node; an inductor including a first portion having a first terminal coupled to the switching circuit, a second portion having a second terminal coupled to the output node, and a third terminal between the first and second portions; and a capacitor coupled to the second terminal, the second terminal to couple to a first additional capacitor, and the third terminal to couple to a second additional capacitor.

21 Claims, 7 Drawing Sheets

(56) References Cited

U.S. PATENT DOCUMENTS

2014/0268615 A1* 9/2014 Yun .................. H01L 23/49822
361/782
2017/0154725 A1* 6/2017 Clavijo .................. H01F 27/40

OTHER PUBLICATIONS

N. Tang et al., "Fully Integrated Buck Converter With Fourth-Order Low-Pass Filter," in IEEE Transactions on Power Electronics, vol. 32, No. 5, pp. 3700-3707, May 2017 (Year: 2017).*
Q. Li, "A Fully-Integrated Buck Converter Design and Implementation for On-Chip Power Supplies," JCP 7, 2012, p. 1270-1277 (Year: 2012).*
N. Krishnapura, V. Gupta and N. Agrawal, "Compact lowpass ladder filters using tapped coils," 2009 IEEE International Symposium on Circuits and Systems (ISCAS), Taipei, 2009, pp. 53-56. (Year: 2009).*
C. Yeh and Y. Lai, "Novel hybrid control technique with constant on/off time control for DC/DC converter to reduce the switching losses," 2009 International Conference on Power Electronics and Drive Systems (PEDS), Taipei, 2009, pp. 848-853 (Year: 2009).*
"International Application Serial No. PCT/US2019/039456, International Search Report dated Oct. 18, 2019", 3 pgs.
"International Application Serial No. PCT/US2019/039456, Written Opinion dated Oct. 18, 2019", 7 pgs.
Tomas, Modeer, et al., "Design and Evaluation of Tapped Inductors for High-Voltage Auxiliary Power Supplies for modular Multilevel Converters", In: 15th International Power Electronics and Motion Control Conference, EPE-PEMC 2012 ECCE Europe, Novi Sad, Serbia, (Sep. 6, 2012), 1-5.

* cited by examiner

US 10,972,001 B2

MULTI-TERMINAL INDUCTORS FOR VOLTAGE REGULATORS

TECHNICAL FIELD

Embodiments described herein pertain to power converters in electronic systems. Some embodiments relate to voltage converters.

BACKGROUND

Voltage converters, such as buck converters, are part of power management units in many electronic devices or systems, such as computers, tablets, and cellular phones, to provide power supply voltage for circuits (e.g., digital circuits) in the device or system. A buck converter can operate in continuous conduction mode (CCM) and discontinuous conduction mode (DCM). DCM often needs high output capacitance for acceptable output voltage ripple. Many conventional techniques are designed to deal with such a voltage ripple. However, as described in more detail below, many of such conventional techniques still have limitations.

DETAILED DESCRIPTION

The techniques described herein include an improved buck voltage converter. The voltage converter includes an inductor having three or more terminals to enable a hybrid DCM-CCM operation of the voltage converter, where the converter input sees DCM and the output (e.g., load) sees a relatively constant current (e.g., magnetically fed CCM current). The described inductor has a specially designed structure including non-uniform resistance regions to further improve hybrid DCM-CCM operation. Other improvements and benefits of the described techniques are discussed below with reference to FIG. 1 through FIG. 11.

Figure 1:
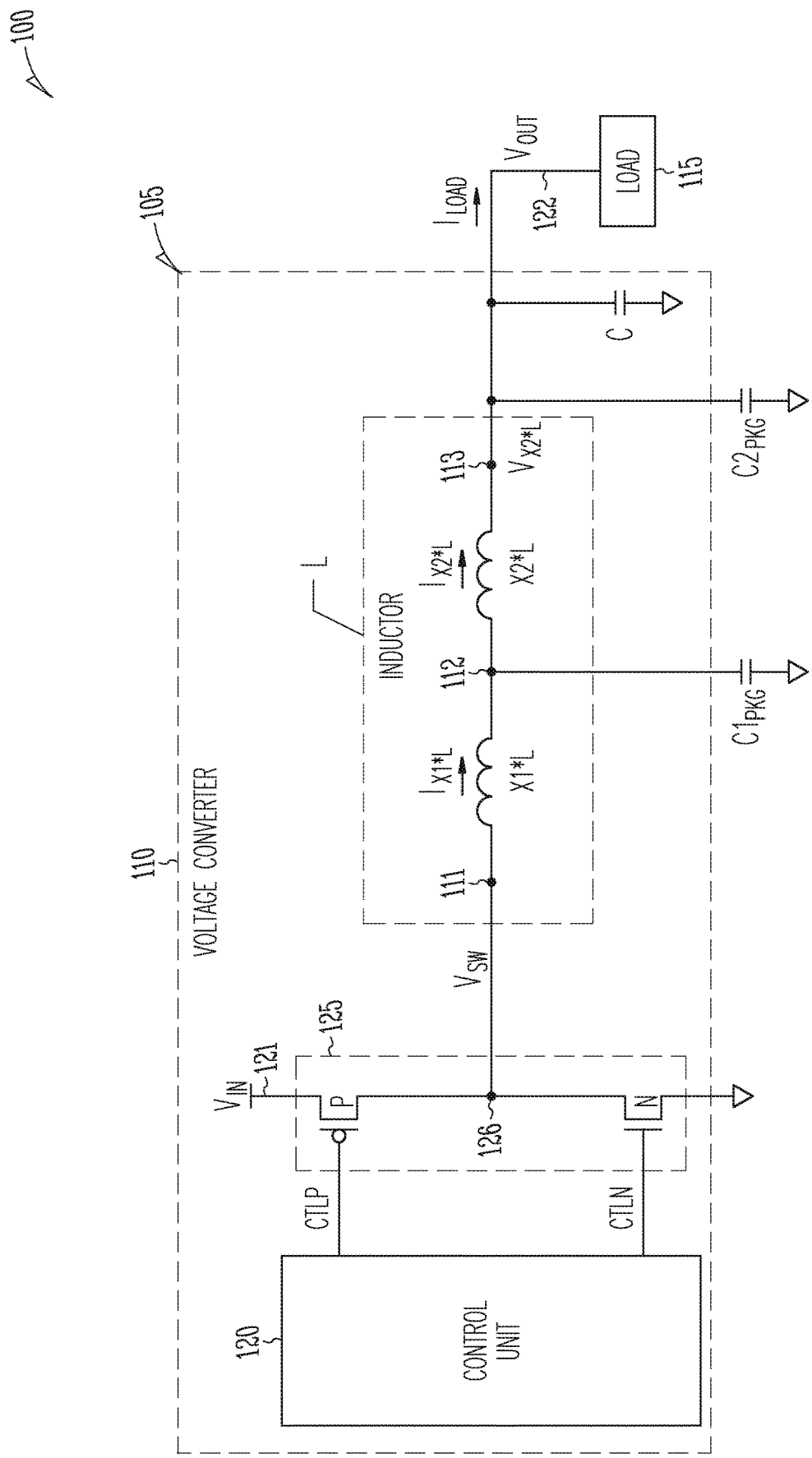
FIG. 1 shows an apparatus including a voltage converter and a load, according to some embodiments described herein.

FIG. 1 shows an apparatus 100 including a voltage converter 110 and a load 115, according to some embodiments described herein. Apparatus 100 can include or be included in an electronic device or system, such as a computer (e.g., desktop, laptop, or notebook), a tablet, a cellular phone, wearable electronics (e.g., smart watches), or other electronic devices or systems.

As shown in FIG. 1, voltage converter 110 can include a node (e.g., supply node) 121 to receive a voltage (e.g., input voltage) $V_{IN}$ and a node (e.g., output node) 122 to provide a voltage (e.g., output voltage) $V_{OUT}$. Voltage converter 110 can be a buck converter, such that the value of voltage $V_{OUT}$ can be less than the value of voltage $V_{IN}$. Load 115 may use voltage $V_{OUT}$ as its operating voltage (e.g., regulated supply voltage). Load 115 can include or be included in a functional unit such as a processor (e.g., a central processing unit (CPU)), a memory device, or other functional units. Voltage converter 110 can be part of a fully-integrated voltage regular (FIVR) included in apparatus 100. Voltage converter 110 and load 115 can be part of a system on chip (SoC), system in package (SiP), or other integrated system.

As shown in FIG. 1, apparatus 100 can include an integrated circuit (IC) die 105 (e.g., a semiconductor die (or an IC chip)). Some or all of the elements of voltage converter 110 can be located in (e.g., formed in or formed on) IC die 105. Voltage converter 110 can include a control unit 120, a switching circuit 125 including transistors P and N, an inductor L, a capacitor C, and capacitors $C1_{PKG}$ and $C2_{PKG}$.

Control unit 120 can operate to generate information CTLP and CTLN to control the switching of (e.g., to turn on or turn off) transistors P and N, respectively, to keep the value of voltage $V_{OUT}$ within a voltage range (e.g., a predetermined voltage range). Control unit 120 can also operate to provide power to load 115, such as to cause a current $I_{LOAD}$ to flow (e.g., to be provided) from node 121 to node 122 through transistor P and inductor L.

Transistor P can include a p-channel field-effect transistor (FET), such as a p-channel metal-oxide semiconductor FET (p-channel MOSFET). Transistor N can include an n-channel FET, such as an n-channel MOSFET. As shown in FIG. 1, transistor P and Transistor N can be coupled to each other at a node (e.g., a common drain) 126, which can provide a voltage $V_{SW}$.

Capacitor C can include a metal-insulator-metal (MIM) capacitor or other types of capacitors. Capacitor C can be located in (e.g., formed in or formed on) IC die 105.

One or both of capacitors $C1_{PKG}$ and $C2_{PKG}$ can include ceramic capacitors, thin-film capacitors, silicon-based capacitors, or other types of capacitors. As shown in FIG. 1, capacitors $C1_{PKG}$ and $C2_{PKG}$ can be located outside IC die 105 (e.g., not formed in and not formed on IC die 105). For example, apparatus 100 can include a package substrate and capacitors $C1_{PKG}$ and $C2_{PKG}$ can be located on or located in the package substrate. The capacitance (in Farad unit) of each of capacitors $C1_{PKG}$ and $C2_{PKG}$ (e.g., off-die (e.g., on-package) capacitors) can be much greater than the capacitance of capacitor C (e.g., on-die capacitor). For example, the capacitance of each of capacitors $C1_{PKG}$ and $C2_{PKG}$ can be at least five times (e.g., 10 times) greater than the capacitance of capacitor C.

Inductor L can include a single structure, such that the structure (e.g., turns or windings) or the material (or materials) of inductor L can extend continuously between terminals 111 and 113 of inductor L. As shown in FIG. 1, inductor L can include a portion $X1*L$ and a portion $X2*L$ continuously coupled to portion $X1*L$. Inductor L can include a terminal 112 located on inductor L between portions $X1*L$ and $X2*L$. Terminal 112 can be a tap (e.g., a contact) on inductor L. Thus, inductor L can be called a tapped inductor. The inductance ("L" in Henry unit) of inductor L can be based on the equation $L=X1*L+X2*L$, where "*" means multiplication; $0<X1<1$; $0<X2<1$; and $X1+X2=1$. As shown in FIG. 1, portion $X1*L$ can be coupled to capacitor $C1_{PKG}$. Portion $X2*L$ can be coupled to capacitor $C2_{PKG}$.

Inductor L can include turns (or windings). Each of portions X1*L and X2*L can include different numbers of turns. Portion X1*L can include the majority of (e.g., most of) the turns, and portion X2*L can include the minority (e.g., the rest) of the turns. For example, if inductor L has three turns, then portion X1*L can include two turns (e.g., the first two turns among the three turns), and portion X2*L can include one turn (e.g., the last turn among the three turns). Thus, in this example, the inductance of portion X1*L is two-thirds (⅔) of the inductance of inductor L, and the inductance of portion X2*L is one-third (⅓) of the inductance of inductor L (e.g., L=(X1*L)+(X2*L)=(⅔)L+(⅓)L). Three turns for inductor L is used as an example here. Inductor L can have a different number of turns. Further, inductor L can include another type of inductor, such that inductor L may not have turns or windings or may have different material.

The structure (e.g., the material) of inductor L can be non-uniform (e.g., intentionally formed to be non-uniform), such that portion X1*L of inductor L can have a per-unit resistance (e.g., a resistance region) that is greater than a per-unit resistance (e.g., a resistance region) of portion X2*L of inductor L (e.g., per-unit resistance of X1*L>per-unit resistance of X2*L). Portion X1*L of inductor L can also have an inductance that is greater than the inductance of portion X2*L of inductor L (e.g., inductance of X1*L>inductance of X2*L). Thus, AC loss in portion X1*L can be minimized by a relatively larger "L" due to lower ripple current. This nature of current of the portion X2*L is mostly constant due to stable voltages on terminals 112 and 113. The voltages at terminals 112 and 113 are relatively stable because the capacitance of capacitors $C1_{PKG}$ and $C2_{PKG}$ are relatively large. Therefore, portion X2*L largely has DC loss, its loss is minimized by lower DC resistance of the inductor X2*L.

FIG. 1 shows an example where inductor L is an on-die inductor. However, inductor L can be located outside the IC die. For example, inductor L can be located on an IC package or alternatively on a printed circuit board (e.g., a mother board).

Voltage converter 110 can operate in CCM or DCM. In CCM, operation current (e.g., current $I_{LOAD}$) can be continuously provided at node 122. In DCM, unlike some conventional buck voltage converters, voltage converter 110 can provide a relatively continuous current (e.g. current $I_{X2*L}$) at node 122. Thus, in DCM, the converter input (e.g., switching circuit 125) sees DCM and the output (e.g., load 115) sees a constant current (e.g., magnetically fed CCM current by portion X2*L of inductor L). As described below, continuously providing current at node 122 can suppress (or reduce) ripple in voltage $V_{OUT}$ provided at node 122.

As shown in FIG. 1, voltage converter 110 can have a voltage $V_{X2*L}$ at terminal 113. Voltage $V_{OUT}$ is based on voltage $V_{X2*L}$ (e.g., the value of voltage $V_{OUT}$ can be equal (e.g., substantially equal) to the value of voltage $V_{X2*L}$). In an operation of apparatus 100, a current $I_{X1*L}$ can flow through portion X1*L, and a current $I_{X2*L}$ can flow through portion X2*L.

Figure 2:
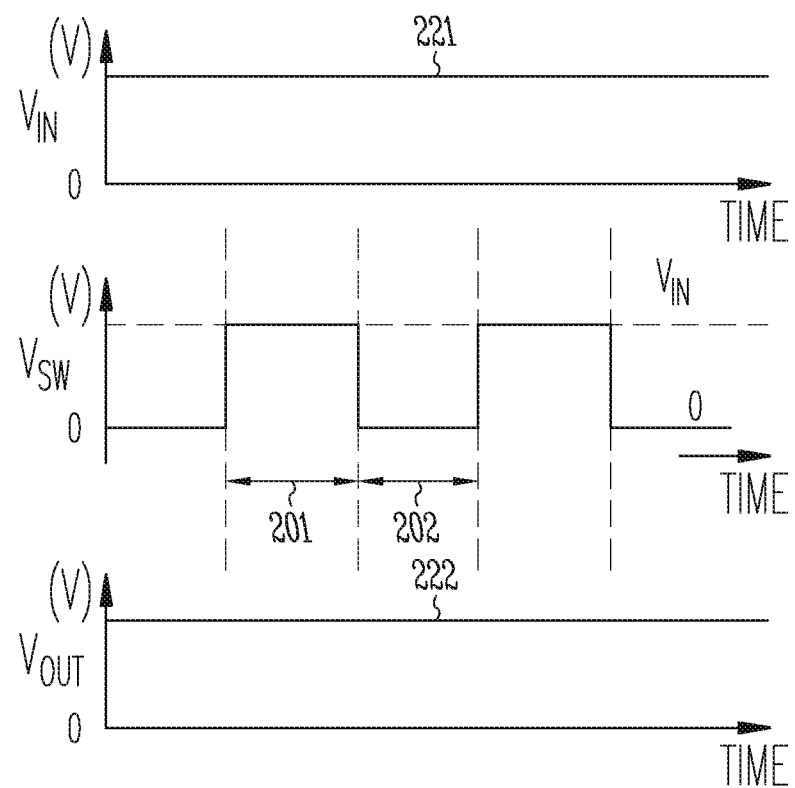
FIG. 2 shows an example waveform of the voltages of the voltage converter of FIG. 1, according to some embodiments described herein.

FIG. 2 shows an example waveform of the voltages $V_{IN}$, $V_{SW}$, and $V_{OUT}$ of voltage converter 110 of FIG. 1, according to some embodiments described herein. As shown in FIG. 2, voltage $V_{SW}$ can switch between a voltage level corresponding to voltage $V_{IN}$ during a time interval 201 and a voltage level corresponding to zero (e.g., ground) during a time interval 202. Voltage converter 110 (FIG. 1) can operate in CCM during time interval 201 and DCM during time interval 202. Voltage $V_{IN}$ can have a relatively constant voltage value 221. Voltage $V_{OUT}$ can have a relatively constant voltage value 222. Voltage value 221 is greater than voltage value 222. Voltage converter 110 can operate such that voltage $V_{OUT}$ can have a ripple that is relatively low ripple during time interval 202 in comparison with some conventional voltage converters.

Voltage converter 110 can have improvements and benefits over some conventional voltage converters. For example, some conventional voltage converters include a two-terminal inductor (without the tapped terminal, such as terminal 112) and an output capacitor at the output stage. During operation of such conventional voltage converters (e.g., during a time interval similar to time interval 201 in FIG. 2), a current pulse is injected into the output stage which can produce ripple upon absorption in the output capacitor. Further, due to the arrangement of the inductor in the conventional voltage converters and parasitic elements associated with package capacitors (e.g., parasitic inductances) in the conventional voltage converters, package capacitors in such arrangements may not draw sufficient charge during a time interval such as time interval 202 in FIG. 2, resulting in excessive ripple in voltage $V_{OUT}$.

Voltage converter 110 may have parasitic elements such as a parasitic inductance between terminal 112 and capacitors $C1_{PKG}$, a parasitic inductance between terminal 113 and capacitors $C2_{PKG}$, and a parasitic inductance between terminal 112 and capacitor C. However, the structure and arrangement of portions X1*L and X2*L of inductor L allows voltage converter 110 to improve (e.g., suppress or reduce) output ripple in voltage $V_{OUT}$. For example, the capacitance of each of capacitors $C1_{PKG}$ and $C2_{PKG}$ can be relatively large. Since terminals 112 and 113 are coupled to capacitors $C1_{PKG}$ and $C2_{PKG}$, respectively, the large capacitances of capacitors $C1_{PKG}$ and $C2_{PKG}$ can keep the voltages at terminals 112 and 113 relatively constant (e.g., stable). The constant voltages at terminals 112 and 113 can keep current $I_{X2*L}$ between terminals 112 and 113 relatively constant. Therefore, output voltage ripple in voltage $V_{OUT}$ (which depends on the voltage at terminal 113) can be relatively low. Thus, the structure and arrangement of inductor L and capacitors $C1_{PKG}$ and $C2_{PKG}$ allows voltage converter 110 to obtain DCM for switching circuit 125 and CCM for the output at node 122 due to relatively constant current (e.g., current $I_{X2*L}$) seen.

The techniques described herein can be used for a wide range of frequencies, including for a relatively low-frequency voltage converter. The suppression or reduction in the ripple in voltage $V_{X2*L}$ at terminal 113 of inductor L, and in turn the suppression or reduction in the ripple in voltage $V_{OUT}$, can be further obtained with more than one inductor (e.g., using two or more of inductor L) in a multi-phase operation (e.g., two-phase operation or more-than-two-phase operation).

Figure 3:
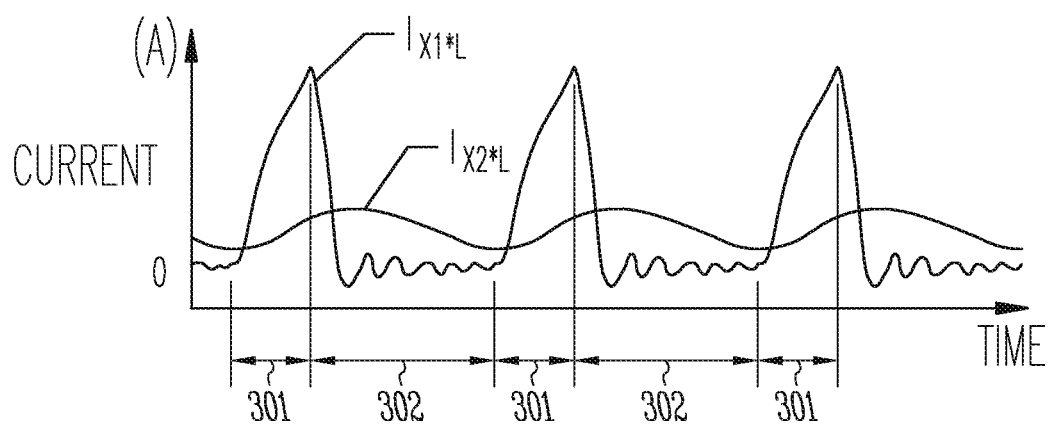
FIG. 3 shows an example waveform of currents in the voltage converter of in FIG. 1, according to some embodiments described herein.

FIG. 3 shows an example waveform of currents $I_{X1*L}$ and $I_{X2*L}$ in voltage converter 110 of FIG. 1, according to some embodiments described herein. In FIG. 3, time intervals 301 and 302 can correspond to time intervals 201 and 202, respectively, of FIG. 2. As shown in FIG. 3, current $I_{X1*L}$ can be continuous during time interval 301 and discontinuous (e.g., close to zero) during a portion of time interval 302. However, current $I_{X2*L}$ can be relatively continuous during time interval 301 and during time interval 302. As described above, voltage converter 110 can operate in CCM during time interval 201 in FIG. 2 (which can also be time interval 301 in FIG. 3) and in DCM during time interval 202 in FIG. 2 (which can also be time interval 302 in FIG. 3). As described above with reference to FIG. 2, a continuous current $I_{X2*L}$ provided by portion X2*L of inductor L can result in a relatively low ripple in voltage $V_{X2*L}$ at terminal 113, and in turn, voltage $V_{OUT}$ can also have a relatively low ripple. This can improve operations of voltage converter 110 loads (e.g., load 115) that are noise sensitive.

Thus, as described above with reference to FIG. 2 and as shown in FIG. 3, voltage converter 110 can have the benefit of saving power during DCM (e.g., during time interval 302) and the benefit of voltage ripple suppression during DCM because current $I_{X2*L}$ at node 113 can be relatively continuous during DCM.

Figure 4:
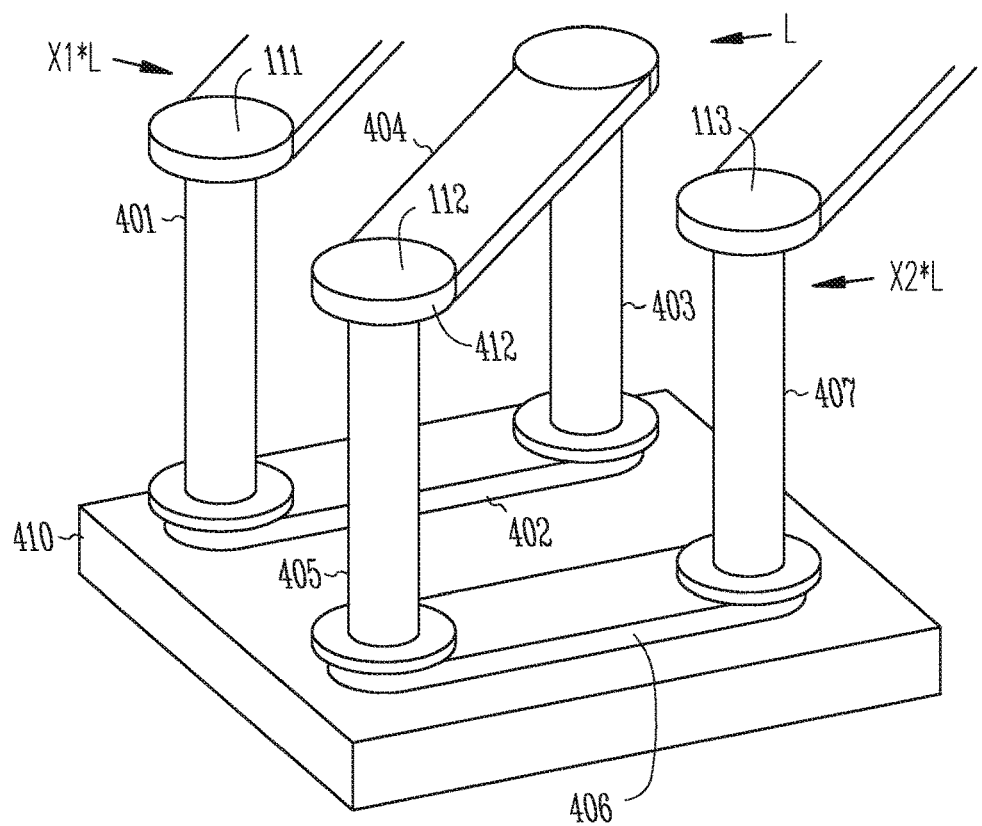
FIG. 4 through FIG. 9 show example structures of an inductor of FIG. 1, according to some embodiments described herein.

FIG. 4 through FIG. 9 show example structures of inductor L of FIG. 1, according to some embodiments described herein. As shown in FIG. 4, inductor L can be a "snake shape" inductor that can include a combination of segments 401, 402, 403, 404, 405, 406, and 407. Segments 401, 403, 405, and 407 can be perpendicular to a substrate 410 (e.g., extending outward from substrate 410). Segments 402, 404, and 406 can be parallel to substrate 410. Portion X1*L of inductor L can include segments 401 through 404 (or alternatively segments 401 through 405), which is a majority of the combination of segments 401 through 407. Portion X2*L of inductor L can include segments 405 through 407 (or alternatively segments 406 and 407), which is a minority (e.g., the rest) of the combination of segments 401 through 407. The combination of segments 401 through 407 can include a tap 412 located at segment 404 (or alternatively segment 405).

As shown in FIG. 4, terminal 111 of inductor L can be located at segment 401, terminal 112 of inductor L can be located at segment 404 (or alternatively segment 405), and terminal 113 of inductor L can be located at segment 407. As described above with reference to FIG. 1, terminal 111 of inductor L can be coupled to switching circuit 125, terminal 112 of inductor L can be coupled to capacitor $C1_{PKG}$, and terminal 113 of inductor L can be coupled to capacitor C, capacitor $C2_{PKG}$, and node 122. Thus, in FIG. 4, segment 401 can be coupled to switching circuit 125 (FIG. 1), tap 412 can be coupled to capacitor $C1_{PKG}$ (FIG. 1), and segment 407 can be coupled to capacitor $C2_{PKG}$ (and capacitor C and node 122 of FIG. 1).

In FIG. 4, portion X1*L can have an inductance greater than an inductance of portion X2*L. Portion X1*L can also have a DC resistance greater than a DC resistance of portion X2*L. For example, segments 401 through 404 can include (e.g., can be formed from) material (or materials) having a higher resistance than the material (or materials) of segments 405 through 407. Segments 401 through 407 can include conductive material such as doped polysilicon, metal, alloy, or a combination of these materials, or other conductive materials.

Figure 5:
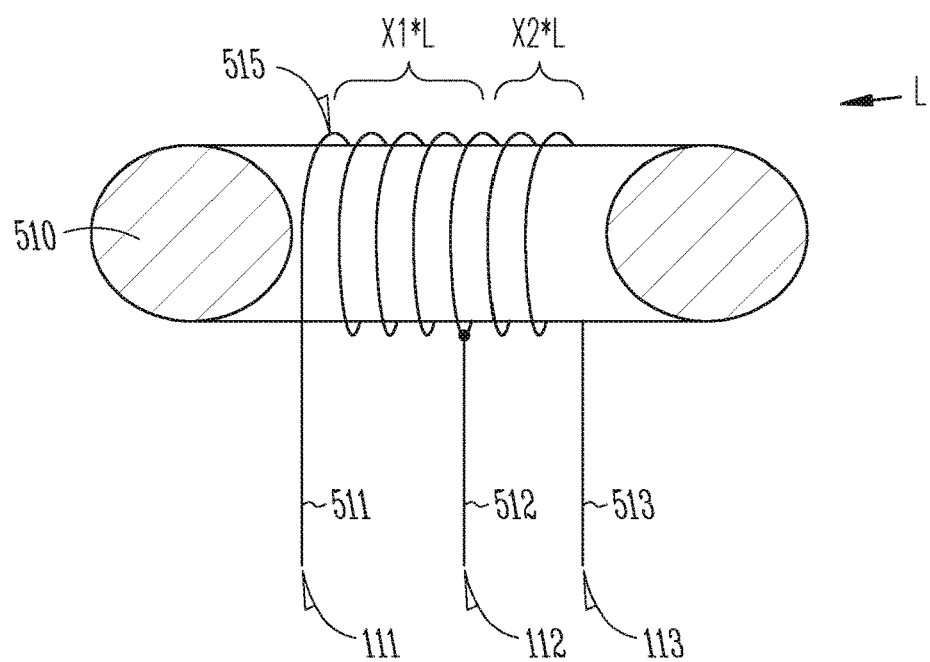

FIG. 5 shows inductor L as a toroidal-type inductor. As shown in FIG. 5, inductor L can include a magnetic core 510 and turns 515 (e.g., windings) wrapped around magnetic core 510. Portion X1*L of inductor L can include a majority of (e.g., most of) turns 515. Portion X2*L can include a minority (e.g., the rest) of turns 515. As shown in FIG. 5, terminal 111 of inductor L can be located at an end 511 of turns 515, terminal 112 of inductor L can be located at a tap 512 on turns 515 between portions X1*L and X2*L, and terminal 113 of inductor L can be located at an end 513 of turns 515. As described above with reference to FIG. 1, terminal 111 of inductor L can be coupled to switching circuit 125, terminal 112 of inductor L can be coupled to capacitor $C1_{PKG}$, and terminal 113 of inductor L can be coupled to capacitor C, capacitor $C2_{PKG}$, and node 122. Thus, in FIG. 5, end 511 of turns 515 can be coupled to switching circuit 125 (FIG. 1), tap 512 can be coupled to capacitor $C1_{PKG}$ (FIG. 1), and end 513 of turns 515 can be coupled to capacitor $C2_{PKG}$ (and capacitor C and node 122 of FIG. 1).

In FIG. 5, portion X1*L can have an inductance greater than an inductance of portion X2*L. Portion X1*L can also have a DC resistance greater than a DC resistance of portion X2*L. For example, turns 515 can be formed from a continuous wire (e.g., a single wire). However, the diameter of the portion of the wire in the majority of turns 515 that forms portion X1*L can be less than the diameter of the portion of the wire in the minority of turns 515 that forms portion X2*L. The wire that forms turns 515 can include conductive material (or materials (e.g., an alloy)).

Figure 6:
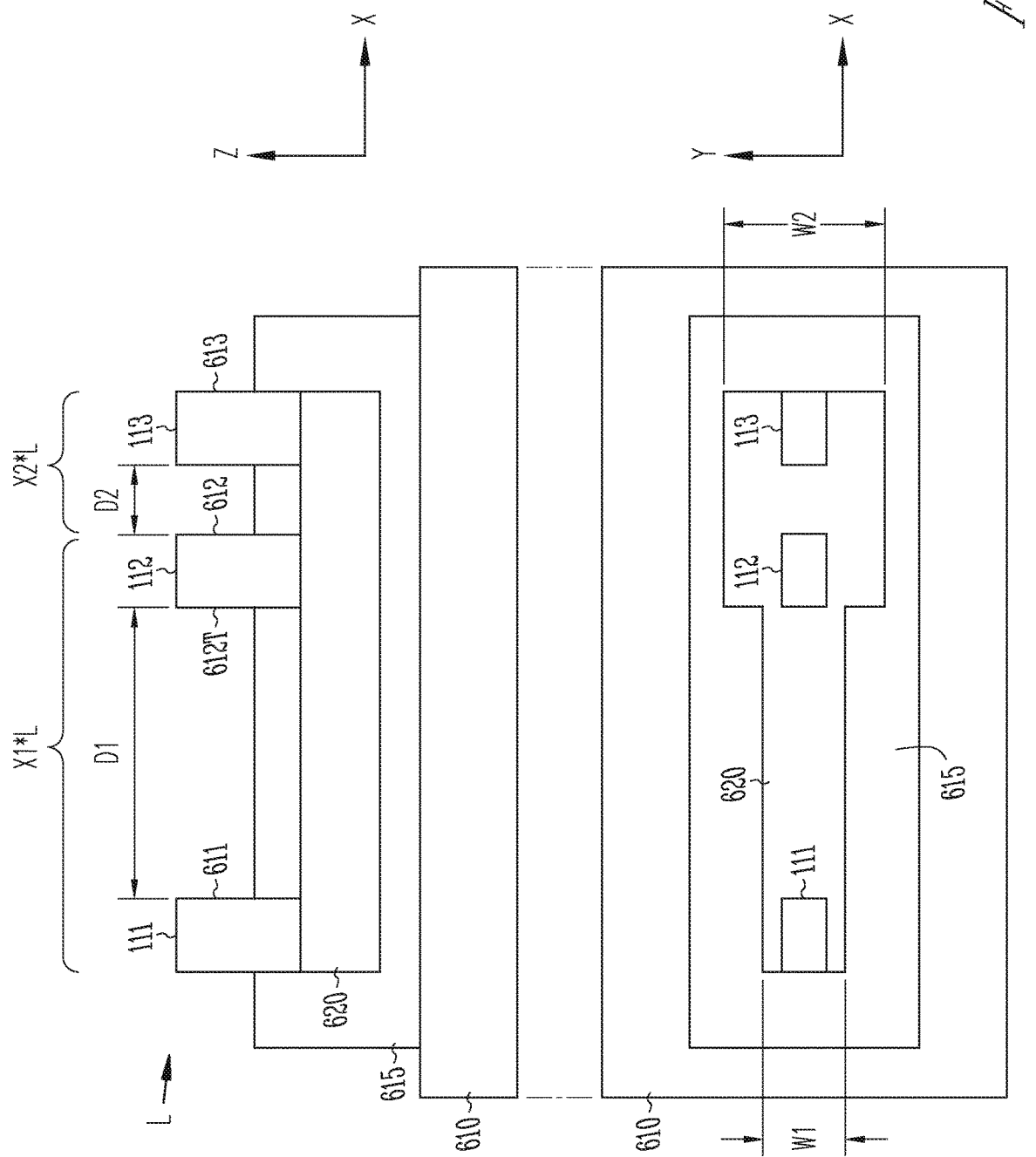

FIG. 6 shows a cross-sectional view (e.g., sideview) in the x-direction and z-direction of inductor L and a top view in the x-direction and y-direction of inductor L. For simplicity, hatching is omitted from the elements shown in FIG. 6.

As shown in FIG. 6, inductor L can be part of a magnetic inductor or magnetic inductor array type. Inductor L can include a substrate (e.g., a semiconductor substrate) 610, a magnetic material 615 formed over substrate 610, and a conductive material 620 formed over at least a portion of magnetic material 615. Inductor L can include conductive segments 611, 612, and 613 formed over different locations on conductive material 620. Each of conductive segments 611, 612, and 613 can have a length perpendicular to (e.g., extending outward from) substrate 610. Conductive segments 611, 612, and 613 can include conductive material (or materials). For example, conductive segments 611, 612, and 613 can include doped polysilicon, metal, alloy, or a combination of these materials, or other conductive materials. As shown in FIG. 6, portion X1*L of inductor L can include part of magnetic material 615, part of conductive material 620, conductive segment 611, and at least part of conductive segment 612. Portion X2*L of inductor L can include part of magnetic material 615, part of conductive material 620, conductive segment 613, and at least part of conductive segment 612.

As shown in FIG. 6, terminal 111 of inductor L can be located at an end of conductive segment 611, terminal 112 of inductor L can be located at a tap 612T at an end of conductive segment 612, and terminal 113 of inductor L can be located at one end of conductive segment 613.

As described above with reference to FIG. 1, terminal 111 of inductor L can be coupled to switching circuit 125, terminal 112 of inductor L can be coupled to capacitor $C1_{PKG}$, and terminal 113 of inductor L can be coupled to capacitor C, capacitor $C2_{PKG}$, and node 122. Thus, in FIG. 6, conductive segment 611 can be coupled to switching circuit 125 (FIG. 1), tap 612T can be coupled to capacitor $C1_{PKG}$ (FIG. 1), and conductive segment 613 can be coupled to capacitor $C2_{PKG}$ (and capacitor C and node 122 of FIG. 1).

As shown in FIG. 6, a distance D1 between conductive segments 611 and 612 is greater than a distance D2 between conductive segments 612 and 613. Conductive material 620 can include a portion having a width W1 and a portion having a width W2 greater than width W1. Conductive segment 611 can be formed over the portion of conductive material 620 that has width W1. Conductive segments 612 and 613 can be formed over the portion of conductive material 620 that has width W2. The dimensions of inductor L as shown in FIG. 6 can allow portion X1*L to have a DC resistance greater than a DC resistance of portion X2*L.

Figure 7:
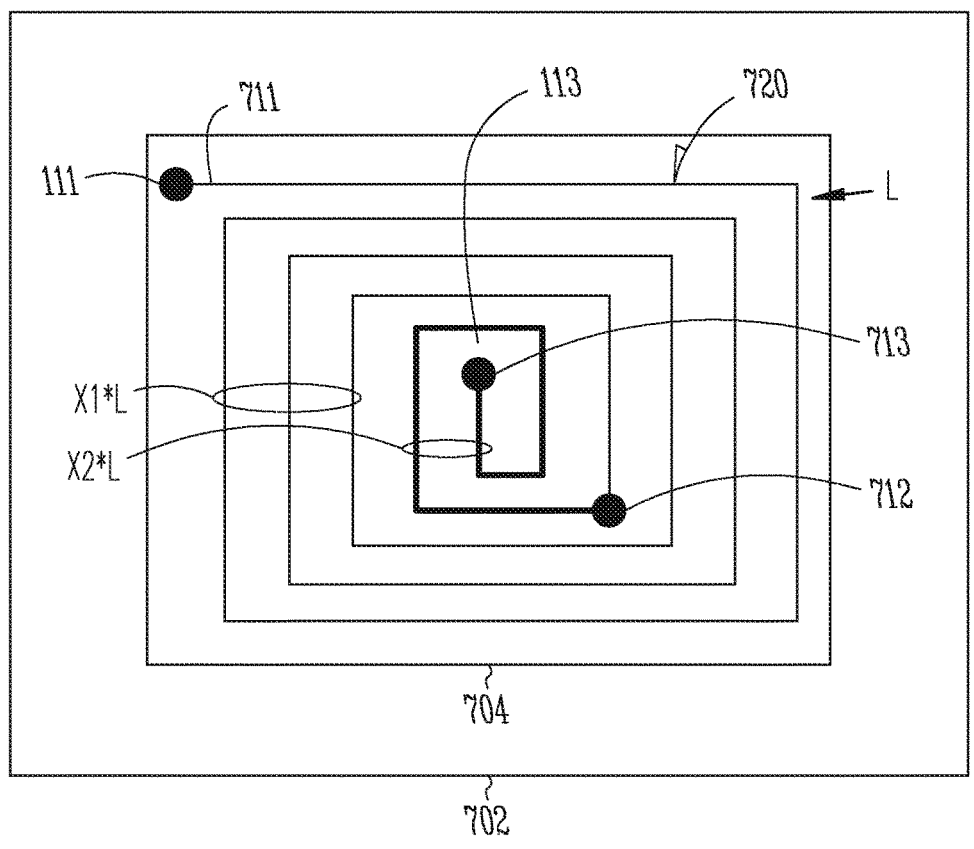

FIG. 7 shows top view of inductor L, which is a spiral-type inductor. Inductor L can include a substrate (e.g., a semiconductor substrate) 702, a magnetic material 704 formed over substrate 702, and a conductive material 720 formed over at least a portion of magnetic material 704. As shown in FIG. 7, conductive material 720 can form a spiral pattern having turns. Portion X1*L of inductor L can include a majority of (e.g., most of) the turns of the spiral pattern (turns in lighter line type). Portion X2*L can include a minority (e.g., the rest) of the turns of the spiral pattern (turns in darker line type). As shown in FIG. 7, terminal 111 of inductor L can be located at an end 711 of the turns of the spiral pattern, terminal 112 of inductor L can be located at a tap 712 on the turns of the spiral pattern between portions X1*L and X2*L, and terminal 113 of inductor L can be located at an end 713 of the turns of the spiral pattern. As described above with reference to FIG. 1, terminal 111 of inductor L can be coupled to switching circuit 125, terminal 112 of inductor L can be coupled to capacitor $C1_{PKG}$, and terminal 113 of inductor L can be coupled to capacitor C, capacitor $C2_{PKG}$, and node 122. Thus, in FIG. 7, end 711 of the turns of the spiral pattern can be coupled to switching circuit 125 (FIG. 1), tap 712 can be coupled to capacitor $C1_{PKG}$ (FIG. 1), and end 713 of the turns of the spiral pattern can be coupled to capacitor $C2_{PKG}$ (and capacitor C and node 122 of FIG. 1).

Portion X1*L of the inductor in FIG. 7 can have a DC resistance greater than a DC resistance of portion X2*L. For example, the turns of the spiral pattern can be formed from a continuous conductive material (e.g., conductive material 720). However, the diameter (or alternatively the thickness) of the conductive material in the majority of the turns of the spiral pattern that forms portion X1*L can be less than the diameter (or alternatively the thickness) of the conductive material in the minority of the turns of the spiral pattern that forms portion X2*L.

Figure 8:
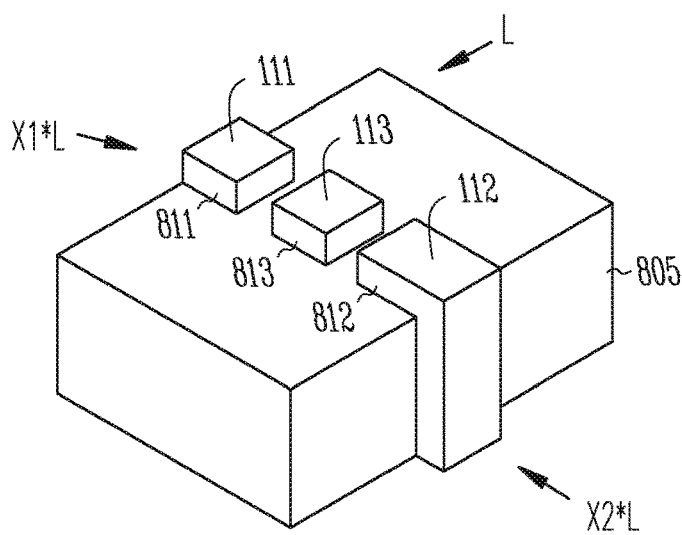

FIG. 8 shows inductor L having a package type. Inductor L can include a package 805 and conductive contacts 811, 812, and 813 that can be located on the surface of package 805. Terminals 111, 112, and 113 of inductor L can be located at conductive contacts 811, 812, and 813, respectively. Conductive contact 812 can be the tap between portions X1*L and X2*L of inductor L, in which conductive contact 811 can be part of portion X1*L, and conductive contact 813 can be part of portion X2*L. Conductive contacts 811, 812, and 813 can have different materials (e.g., can be formed from different metal materials).

As described above with reference to FIG. 1, terminal 111 of inductor L can be coupled to switching circuit 125, terminal 112 of inductor L can be coupled to capacitor $C1_{PKG}$, and terminal 113 of inductor L can be coupled to capacitor C, capacitor $C2_{PKG}$, and node 122. Thus, in FIG. 8, conductive contact 811 can be coupled to switching circuit 125 (FIG. 1), conductive contact 812 (e.g., the tap) can be coupled to capacitor $C1_{PKG}$ (FIG. 1), and conductive contact 813 can be coupled to capacitor $C2_{PKG}$ (and capacitor C and node 122 of FIG. 1).

Figure 9:
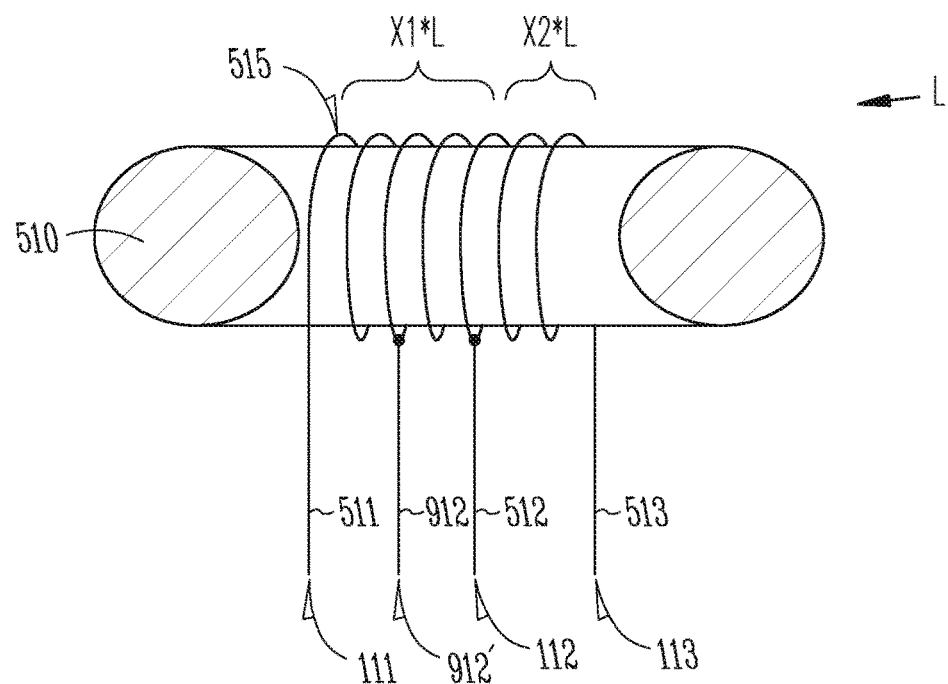

FIG. 9 shows inductor L having a multi-tap connection. Inductor L of FIG. 9 can be similar to inductor L (e.g., a toroidal-type inductor) of FIG. 5, except that inductor L of FIG. 9 can have multiple taps 512 and 912 (whereas inductor L of FIG. 5 has a single tap 512). For simplicity, the description of similar or identical elements between inductor L of FIG. 5 and inductor L of FIG. 9 is not repeated. As a comparison, inductor L of FIG. 9 has more taps than inductor L of FIG. 5, and inductor L of FIG. 9 is a 4-terminal inductor (e.g., terminals 111, 112, 113, and 912') whereas inductor L of FIG. 5 is a 3-terminal inductor (e.g., terminals 111, 112, and 113). In FIG. 9, tap 912 (at terminal 912') of inductor L can be coupled to a capacitor (e.g., package capacitor) similar to capacitor $C1_{PKG}$ (or capacitor $C2_{PKG}$) of FIG. 1. Inductor L of FIG. 9 can have improvements and benefits similar to those of inductor L described above with reference to FIG. 1 through FIG. 3.

Figure 10:
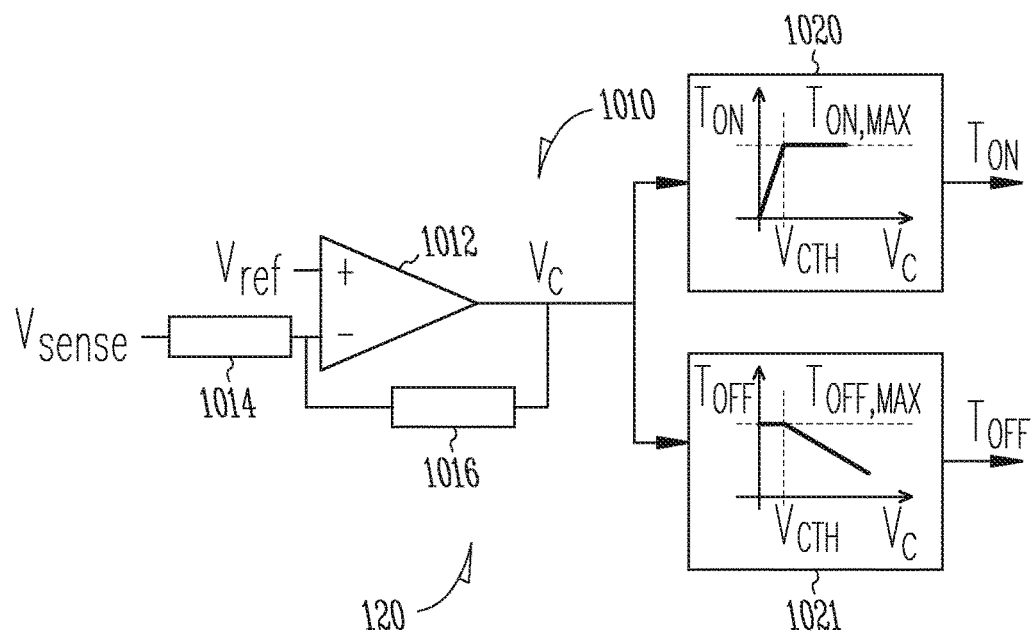
FIG. 10 shows a portion of a control unit of the voltage converter of FIG. 1, according to some embodiments described herein.

FIG. 10 shows a portion of control unit 120 of voltage converter 110 of FIG. 1, according to some embodiments described herein. The following description refers to FIG. 1 through FIG. 4 and FIG. 10. As load decreases with constant peak turn-off current (or with constant on-time) operation, the DCM frequency reduces via elongation of the switch off-time (e.g., during time interval 202 of FIG. 2). For a low enough load, this can eventually lead to higher output voltage ripple in voltage $V_{OUT}$ (FIG. 1) for any finite output capacitance value (e.g., the capacitance at node 122). To limit ripple voltage at very light (e.g., ultra-light) loads, control unit 120 can be configured to effectively clamp frequency (e.g., the switching frequency of switching circuit 125) to a lower limit.

In one configuration, control unit 120 can perform peak current threshold scaling with load current. The peak current threshold can be reduced in proportion to the average load current. This reduces input energy per switching cycle so that an off-time increase may not be required to consume it. The frequency is thereby limited, as is the voltage ripple.

In another configuration, control unit 120 can operate to control a transition from constant off-time ($T_{OFF}$) control to constant on-time ($T_{ON}$) control when reaching a minimum frequency. The on-time and off-time can correspond to time interval 201 and time interval 202, respectively, of FIG. 2.

As shown in FIG. 10, control unit 120 can include a circuit 1010, which can include an op-amp 1012, and resistor-capacitor networks formed by a resistor circuit 1014 and a capacitor circuit 1016. Voltage $V_{ref}$ is a reference voltage (e.g., a predetermined voltage) that can be used for a comparison with voltage $V_{sense}$. Voltage $V_{sense}$ is based on the voltage Vc (e.g., $V_{OUT}$ at node 122 of FIG. 1) measured by a control loop (e.g., a feedback loop, not shown) of control unit 120. Voltage Vc (e.g., a control voltage) can be based on a difference between voltage $V_{ref}$ and voltage $V_{sense}$. Since voltage $V_{sense}$ is based on voltage $V_{OUT}$ at node 122 (FIG. 1), voltage Vc can reflect current $I_{LOAD}$ at node 122. For example, if current $I_{LOAD}$ increases, then voltage Vc increases. If current $I_{LOAD}$ decreases, voltage Vc decreases. Voltage $V_{CTH}$ is a threshold voltage that control unit 120 uses to control the switching (e.g., control $T_{ON}$ and $T_{OFF}$) of switching circuit 125 (FIG. 1). In FIG. 10, control portions 1020 and 1021 represent control operations performed by control unit 1120 to control on-time $T_{ON}$ and off-time $T_{OFF}$, respectively, based on the result of the comparison performed by circuit 1010.

For example, as shown in both control portions 1020 and 1021, if Vc<$V_{CTH}$ then control unit 120 can operate to control on-time $T_{ON}$ (e.g., constantly increase $T_{ON}$) and hold off-time $T_{OFF}$ at a fixed value (e.g., keep $T_{OFF}$ unchanged). Thus, on-time $T_{ON}$ is increased with increase in load demand (e.g., current $I_{LOAD}$ increases). In FIG. 10, the label "$T_{ON, MAX}$" can represent a maximum value (in time units) that control unit 120 can apply to on-time $T_{ON}$, and the label "$T_{OFF,MAX}$" can represent a maximum value (in time units) that control unit 120 can apply to off-time $T_{OFF}$.

In another example, as shown in both control portions 1020 and 1021, if Vc $V_{CTH}$ then control unit 120 can operate to control off-time $T_{OFF}$ (e.g., constantly increase $T_{OFF}$) and hold on-time $T_{ON}$ at a fixed value (e.g., keep $T_{ON}$ unchanged). Thus, off-time $T_{OFF}$ is increased with decreased load demand (e.g., current $I_{LOAD}$ decreases).

The operation described above allows control unit 120 to control the current at node 122 (e.g., current $I_{LOAD}$) to suppress or reduce ripple in $V_{OUT}$ for light load conditions. Clamping the switching frequency to a relatively lower value may not improve the converter loss. The operation may revert to CCM at the low switching frequency so that the RMS value of the current is closer to its average value, resulting in lower percentage conduction loss. The lower FET (e.g., transistor N in FIG. 1) may be allowed to conduct to enable zero voltage turn-on of the upper FET (e.g., transistor P), a benefit that is lost in regular DCM.

Figure 11:
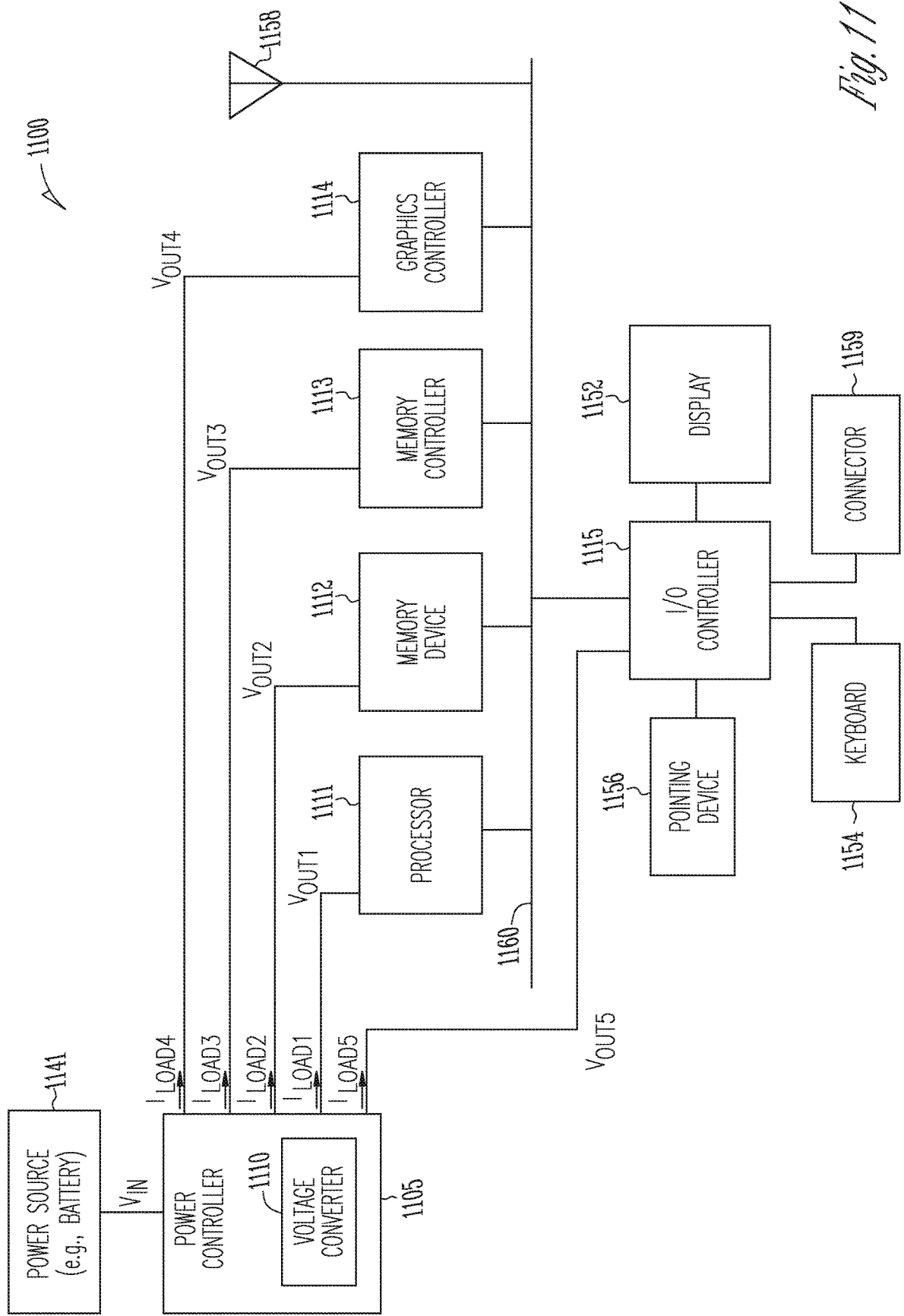
FIG. 11 shows an apparatus in the form of a system (e.g., electronic system), according to some embodiments described herein.

FIG. 11 shows an apparatus in the form of a system (e.g., electronic system) 1100, according to some embodiments described herein. System 1100 can include or be included in a computer, a cellular phone, or other electronic systems. As shown in FIG. 11, system 1100 can include a power controller 1105, a processor 1111, a memory device 1112, a memory controller 1113, a graphics controller 1114, an input and output (I/O) controller 1115, a display 1152, a keyboard 1154, a pointing device 1156, at least one antenna 1158, a connector 1159, and a bus 1160.

Each of processor 1111, memory device 1112, memory controller 1113, graphics controller 1114, and I/O controller 1115 can include a load, such as load 115 of FIG. 1.

Processor 1111 can include a general-purpose processor or an application specific integrated circuit (ASIC). Processor 1111 can include a CPU.

Memory device 1112 can include a dynamic random-access memory (DRAM) device, a static random-access memory (SRAM) device, a flash memory device, phase change memory, or a combination of these memory devices, or other types of memory. FIG. 11 shows an example where memory device 1112 is a stand-alone memory device separated from processor 1111. In an alternative arrangement, memory device 1112 and processor 1111 can be located on the same integrated circuit (IC) die. In such an alternative arrangement, memory device 1112 is an embedded memory in processor 1111, such as embedded DRAM (eDRAM), embedded SRAM (eSRAM), embedded flash memory, or another type of embedded memory.

Display 1152 can include a liquid crystal display (LCD), a touchscreen (e.g., capacitive or resistive touchscreen), or another type of display. Pointing device 1156 can include a mouse, a stylus, or another type of pointing device.

I/O controller 1115 can include a communication module for wired or wireless communication (e.g., communication through one or more antennas 1158). Such wireless communication may include communication in accordance with a WiFi communication technique, a Long-Term Evolution Advanced (LTE-A) communication technique, or other communication techniques.

I/O controller 1115 can also include a module to allow system 1100 to communicate with other devices or systems in accordance with one or more standards or specifications (e.g., I/O standards or specifications), including Universal Serial Bus (USB), DisplayPort (DP), High-Definition Multimedia Interface (HDMI), Thunderbolt, Peripheral Component Interconnect Express (PCIe), Ethernet, and other specifications.

Connector 1159 can be arranged (e.g., can include terminals, such as pins) to allow system 1100 to be coupled to an external device (or system). This may allow system 1100 to communicate (e.g., exchange information) with such a device (or system) through connector 1159.

Connector 1159 and at least a portion of bus 1160 can include conductive lines that conform with at least one of USB, DP, HDMI, Thunderbolt, PCIe, Ethernet, and other specifications.

Power controller 1105 can be arranged to receive power (e.g., supply voltage) from a power source 1141 that can provide a voltage $V_{IN}$, which can correspond to voltage $V_{IN}$ described above with reference to FIG. 1 through FIG. 3. Power controller 1105 can provide voltages $V_{OUT1}$, $V_{OUT2}$, $V_{OUT3}$, $V_{OUT4}$, and $V_{OUT5}$ and currents $I_{LOAD1}$, $I_{LOAD2}$, $I_{LOAD3}$, $I_{LOAD4}$, and $I_{LOAD5}$. Each of voltages $V_{OUT1}$, $V_{OUT2}$, $V_{OUT3}$, $V_{OUT4}$, and $V_{OUT5}$ and currents $I_{LOAD1}$, $I_{LOAD2}$, $I_{LOAD3}$, $I_{LOAD4}$, and $I_{LOAD5}$ can correspond to voltage $V_{OUT}$ and current $I_{LOAD}$, respectively, described above with reference to FIG. 1 through FIG. 3. As shown in FIG. 11, voltages $V_{OUT1}$, $V_{OUT2}$, $V_{OUT3}$, $V_{OUT4}$, and $V_{OUT5}$ and currents $I_{LOAD1}$, $I_{LOAD2}$, $I_{LOAD3}$, $I_{LOAD4}$, and $I_{LOAD5}$ can be provided to processor 1111, memory device 1112, memory controller 1113, graphics controller 1114, and I/O controller 1115, respectively.

Power controller 1105 can include a voltage converter 1110 to control the value of at least one of voltages $V_{OUT1}$, $V_{OUT2}$, $V_{OUT3}$, $V_{OUT4}$, and $V_{OUT5}$ and currents $I_{LOAD1}$, $I_{LOAD2}$, $I_{LOAD3}$, $I_{LOAD4}$, and $I_{LOAD5}$ in ways similar to (or the same as) ways of controlling the value of voltage $V_{OUT}$ and current $I_{LOAD}$ described above with reference to FIG. 1 through FIG. 3.

FIG. 11 shows the components of system 1100 arranged separately from each other as an example. For example, each of power controller 1105, processor 1111, memory device 1112, memory controller 1113, graphics controller 1114, and I/O controller 1115 can be located on a separate IC die (e.g., a semiconductor die or an IC chip). In some arrangements, two or more components (e.g., processor 1111, memory device 1112, graphics controller 1114, and I/O controller 1115) of system 1100 can be located on the same die (e.g., same IC chip), forming an SoC, an SiP, or other types of systems.

In some arrangements, system 1100 does not have to include a display. Thus, display 1152 can be omitted from system 1100. In some arrangements, system 1100 does not have to include an antenna 1158. Thus, antenna 1158 can be omitted from system 1100.

The illustrations of apparatuses (e.g., apparatus 100 and system 1100) and methods (e.g., the operations of voltage converter 110 described above with reference to FIG. 1 through FIG. 11) are intended to provide a general understanding of the structure of various embodiments and are not intended to provide a complete description of all the elements and features of apparatuses 100 that might make use of the structures described herein.

The apparatuses (e.g., apparatus 100 and system 1100) described herein may include or be included in electronic circuitry, such as high-speed computers, communication and signal-processing circuitry, single- or multi-processor modules, single or multiple embedded processors, multi-core processors, message information switches, and application-specific modules including multilayer, multi-chip modules. Such apparatuses may further be included as sub-components within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 5) players), vehicles, medical devices (e.g., heart monitor, blood pressure monitor, etc.), set top boxes, and others.

In the detailed description and the claims, a list of items joined by the term "one of" can mean only one of the listed items. For example, if items A and B are listed, then the phrase "one of A and B" means A only (excluding B), or B only (excluding A). In another example, if items A, B, and C are listed, then the phrase "one of A, B, and C" means A only, B only, or C only. Item A can include a single element or multiple elements. Item B can include a single element or multiple elements. Item C can include a single element or multiple elements.

In the detailed description and the claims, a list of items joined by the term "at least one of" can mean any combination of the listed items. For example, if items A and B are listed, then the phrase "at least one of A and B" means A only, B only, or A and B. In another example, if items A, B, and C are listed, then the phrase "at least one of A, B, and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

ADDITIONAL NOTES AND EXAMPLES

Example 1 includes subject matter (such as a device, an electronic apparatus (e.g., circuit, electronic system, or both), or a machine) including a switching circuit included in a buck converter, an output node, an inductor including a first portion having a first terminal coupled to the switching circuit, a second portion having a second terminal coupled to the output node, and a third terminal between the first and second portions, and a capacitor coupled to the second terminal, the second terminal to couple to a first additional capacitor, and the third terminal to couple to a second additional capacitor.

In Example 2, the subject matter of Example 1 may optionally include, wherein the inductor has turns, and the first portion of the inductor includes a majority of the turns.

In Example 3, the subject matter of Example 1 or 2 may optionally include, wherein the first portion of the inductor has a first resistance, the second portion of the inductor has a second resistance, and the first resistance is greater than the second resistance.

In Example 4, the subject matter of Example 1 or 2 may optionally include, wherein the capacitor is located on an integrated circuit die, and the first and second additional capacitors are located outside the integrated circuit die.

In Example 5, the subject matter of Example 4 may optionally include, wherein the integrated circuit die is located on a package substrate, and the first and second additional capacitors are located on the package substrate.

In Example 6, the subject matter of Example 1 may optionally include, wherein the inductor further includes a fourth terminal between the first and second terminals.

In Example 7, the subject matter of Example 1 may optionally include, wherein the inductor includes a combination of segments, the segments including first segments parallel to a substrate and second segments perpendicular to the substrate, the first portion of the inductor includes a majority of the combination of segments, and the second portion of the inductor includes a minority of the combination of segments.

In Example 8, the subject matter of Example 7 may optionally include, the majority of the combination of segments has a first resistance, the minority of the combination of segments has a second resistance, and the first resistance is greater than the second resistance.

In Example 9, the subject matter of Example 1 may optionally include, the inductor includes a magnetic core, and turns wrapped around the magnetic core, the first portion of the inductor includes a majority of the turns, and the second portion of the inductor includes a minority of the turns.

In Example 10, the subject matter of Example 9 may optionally include, the majority of the turns has a first resistance, the minority of the turns has a second resistance, and the first resistance is greater than the second resistance.

In Example 11, the subject matter of Example 1 may optionally include, the inductor includes a magnetic material formed over a substrate, a conductive material formed over at least a portion of the magnetic material, a first conductive segment formed over the conductive material and having a length perpendicular to the substrate, the first conductive segment coupled to the switching circuit, a second conductive segment formed over the conductive material and having a length perpendicular to the substrate, and a third conductive segment formed over the conductive material and having a length perpendicular to the substrate, wherein the third conductive segment is between the first and second conductive segments and coupled to the third terminal.

In Example 12, the subject matter of Example 11 may optionally include, the inductor includes turns in a spiral pattern, the first portion of the inductor includes a majority of the turns, and the second portion of the inductor includes a minority of the turns.

In Example 13, the subject matter of Example 1 may optionally include, the majority of the turns has a first resistance, the minority of the turns has a second resistance, and the first resistance is greater than the second resistance.

In Example 14, the subject matter of Example 13 may optionally include, the inductor includes package, a first conductive contact located on a surface of the package and coupled to the first terminal of the inductor, a second conductive contact located on the surface of the package and coupled to the third terminal of the inductor, and a third conductive contact located on the surface of the package and coupled to the second terminal of the inductor.

Example 15 includes subject matter (such as a device, an electronic apparatus (e.g., circuit, electronic system, or both), or a machine) including a switching circuit included in a buck converter, an output node, an inductor including a first portion having a first terminal coupled to the switching circuit, a second portion having a second terminal coupled to the output node, and a third terminal between the first and second portions, the first portion having a first resistance, and the second portion having a second resistance different from the first resistance, a capacitor coupled to the second terminal of the inductor, a first additional capacitor coupled to the third terminal of the inductor, and a second additional capacitor coupled to the second terminal of the inductor.

In Example 16, the subject matter of Example 15 may optionally include, comprising a control unit to increase an on-time of the switching circuit coupled to the first terminal and cause an off-time of the switching circuit to be unchanged if a control voltage that reflects a current at the output node at a first time is less than a reference value.

In Example 17 the subject matter of Example 16 may optionally include, the control unit is to decrease the off-time of the switching circuit and cause the on-time of the switching circuit to be unchanged if the control voltage that reflects the current at the output node at a second time is greater than the reference value.

In Example 18, the subject matter of Example 15 may optionally include, the capacitor is located on an integrated circuit die, and the first and second additional capacitors are located outside the integrated circuit die.

Example 19 includes subject matter (such as a device, an electronic apparatus (e.g., circuit, electronic system, or both), or a machine) including a processor, and a power controller coupled to the processor, the power controller including a switching circuit included in a buck converter, an output node, an inductor including a first portion having a first terminal coupled to the switching circuit, a second portion having a second terminal coupled to the output node, and a third terminal between the first and second portions, and a capacitor coupled to the second terminal, the second terminal to couple to a first additional capacitor, and the third terminal to couple to a second additional capacitor.

In Example 20, the subject matter of Example 19 may optionally include, further comprising a connector coupled to the processor, the connector conforming with one of Universal Serial Bus (USB), High-Definition Multimedia Interface (HDMI), Thunderbolt, Peripheral Component Interconnect Express (PCIe), and Ethernet specifications.

In Example 21, the subject matter of Example 19 may optionally include, further comprising an antenna coupled to the processor.

The subject matter of Example 1 through Example 21 may be combined in any combination.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description. Therefore, the scope of various embodiments is determined by the appended claims, along with the full range of equivalents to which such claims are entitled.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus comprising:
   a switching circuit included in a buck converter;
   an output node;
   an inductor including a first portion having a first terminal coupled to the switching circuit, a second portion having a second terminal coupled to the output node, and a third terminal between the first portion and the second portion, the first portion directly coupled to the second portion at a contact location, and the third terminal directly coupled to the contact location without going through a turn of the inductor; and
   a capacitor coupled to the second terminal, the second terminal to couple to a first additional capacitor, and the third terminal to directly couple to a first plate of a second additional capacitor, the second additional capacitor including a second plate directly coupled to a ground node wherein the capacitor is located on an integrated circuit die, and the first additional capacitor and the second additional capacitor are located outside the integrated circuit die.

2. The apparatus of claim 1, wherein the first portion of the inductor has a first resistance, the second portion of the inductor has a second resistance, and the first resistance is greater than the second resistance.

3. The apparatus of claim 1, wherein the integrated circuit die is located on a package substrate, and the first and second additional capacitors are located on the package substrate.

4. The apparatus of claim 1, wherein the inductor further includes a fourth terminal between the first terminal and the second terminal.

5. The apparatus of claim 1, wherein the inductor includes turns in a spiral pattern.

6. The apparatus of claim 5, wherein the majority of the turns has a first resistance, the minority of the turns has a second resistance, and the first resistance is greater than the second resistance.

7. An apparatus comprising:
   a switching circuit included in a buck converter;
   an output node;
   an inductor including a first portion having a first terminal coupled to the switching circuit, a second portion having a second terminal coupled to the output node, and a third terminal between the first portion and the second portion, the first portion directly coupled to the second portion at a contact location, and the third terminal directly coupled to the contact location without going through a turn of the inductor; and
   a capacitor coupled to the second terminal, the second terminal to couple to a first additional capacitor, and the third terminal to directly couple to a first plate of a second additional capacitor, the second additional capacitor including a second plate directly coupled to a ground node, wherein the inductor includes a combination of segments, the combination of segments including a first group of segments parallel to a substrate and a second group of segments perpendicular to the substrate, the first portion of the inductor includes a majority of the combination of segments; and
   the second portion of the inductor includes a minority of the combination of segments, and wherein, the first group of segments includes a first segment parallel to the substrate and a second segment parallel to the substrate;
   the first segment is located over the substrate; and
   the second segment is located over the first segment, such that the first segment is between the second segment and the substrate.

8. The apparatus of claim 7, wherein the majority of the combination of segments has a first resistance, the minority of the combination of segments has a second resistance, and the first resistance is greater than the second resistance.

9. An apparatus comprising:
   a switching circuit included in a buck converter;
   an output node;
   an inductor including a first portion having a first terminal coupled to the switching circuit, a second portion having a second terminal coupled to the output node, and a third terminal between the first portion and the second portion, the first portion directly coupled to the second portion at a contact location, and the third terminal directly coupled to the contact location without going through a turn of the inductor; and
   a capacitor coupled to the second terminal, the second terminal to couple to a first additional capacitor, and the third terminal to directly couple to a first plate of a second additional capacitor, the second additional capacitor including a second plate directly coupled to a ground node wherein the inductor has turns, and the first portion of the inductor includes a majority of the turns, wherein the inductor includes a magnetic core, and turns wrapped around the magnetic core such that the turns directly contact the magnetic core.

10. The apparatus of claim 9, wherein the majority of the turns has a first resistance, the minority of the turns has a second resistance, and the first resistance is greater than the second resistance.

11. An apparatus comprising:
a switching circuit included in a buck converter;
an output node;
an inductor including a first portion having a first terminal coupled to the switching circuit, a second portion having a second terminal coupled to the output node, and a third terminal between the first portion and the second portion, the first portion directly coupled to the second portion at a contact location, and the third terminal directly coupled to the contact location without going through a turn of the inductor; and
a capacitor coupled to the second terminal, the second terminal to couple to a first additional capacitor, and the third terminal to directly couple to a first plate of a second additional capacitor, the second additional capacitor including a second plate directly coupled to a ground node, wherein the inductor includes:
a magnetic material formed over a semiconductor substrate;
a conductive material formed over at least a portion of the magnetic material;
a first conductive segment formed over the conductive material and having a length perpendicular to the semiconductor substrate, the first conductive segment coupled to the switching circuit;
a second conductive segment formed over the conductive material and having a length perpendicular to the semiconductor substrate; and
a third conductive segment formed over the conductive material and having a length perpendicular to the semiconductor substrate, wherein the third conductive segment is between the first conductive segment and the second conductive segment and coupled to the third terminal.

12. The apparatus of claim 11, wherein the conductive material is formed on a single layer over the semiconductor substrate.

13. The apparatus of claim 12, wherein a portion of the magnetic material is between the conductive material and the substrate.

14. The apparatus of claim 13, wherein, the conductive material is between the first conductive segment and the portion of the magnetic material, the conductive material is between the second conductive segment and the portion of the magnetic material, and t conductive material is between the third conductive segment and the portion of the magnetic material.

15. An apparatus comprising:
a switching circuit included in a buck converter;
an output node;
an inductor including a first portion having a first terminal coupled to the switching circuit, a second portion having a second terminal coupled to the output node, and a third terminal between the first portion and the second portion, the first portion directly coupled to the second portion at a contact location, and the third terminal directly coupled to the contact location without going through a turn of the inductor; and
a capacitor coupled to the second terminal, the second terminal to couple to a first additional capacitor, and the third terminal to directly couple to a first plate of a second additional capacitor, the second additional capacitor including a second plate directly coupled to a ground node wherein the inductor has turns, and the first portion of the inductor includes a majority of the turns, wherein the inductor includes a package, a first conductive contact located on a surface of the package and coupled to the first terminal of the inductor, a second conductive contact located on the surface of the package and coupled to the third terminal of the inductor, and a third conductive contact located on the surface of the package and coupled to the second terminal of the inductor, and wherein at least part of the first portion is inside the package, and wherein at least part of the second portion is inside the package.

16. An apparatus comprising:
a switching circuit included in a buck converter;
an output node;
an inductor including a first portion having a first terminal coupled to the switching circuit, a second portion having a second terminal coupled to the output node, and a third terminal between the first portion and the second portion, the first portion directly coupled to the second portion at a contact location, and the third terminal directly coupled to the contact location without going through a turn of the inductor, the first portion having a first resistance, and the second portion having a second resistance different from the first resistance;
a capacitor coupled to the second terminal of the inductor;
a first additional capacitor including a first plate directly coupled to the third terminal of the inductor and a second plate directly coupled to a ground node; and
a second additional capacitor coupled to the second terminal of the inductor, wherein the capacitor is located on an integrated circuit die, and the first additional capacitor and second additional capacitor are located outside the integrated circuit die.

17. The apparatus of claim 16, further comprising a control unit to increase an on-time of the switching circuit coupled to the first terminal and cause an off-time of the switching circuit to be unchanged if a control voltage that reflects a current at the output node at a first time is less than a reference value.

18. The apparatus of claim 17, wherein the control unit is to increase the off-time of the switching circuit and cause the on-time of the switching circuit to be unchanged if the control voltage that reflects the current at the output node at a second time is greater than the reference value.

19. An apparatus comprising:
a processor; and
a power controller coupled to the processor, the power controller including:
a switching circuit included in a buck converter;
an output node;
an inductor including a first portion having a first terminal coupled to the switching circuit, a second portion having a second terminal coupled to the output node, and a third terminal between the first portion and the second portion, the first portion directly coupled to the second portion at a contact location, and the third terminal directly coupled to the contact location without going through a turn of the inductor; and a capacitor coupled to the second terminal, the second terminal to couple to a first additional capacitor, and the third terminal to directly couple to a first plate of a second additional capacitor, the second additional capacitor including a second plate directly coupled to a ground node, wherein the capacitor is located on an integrated circuit die, and the first additional capacitor and second additional capacitor are located outside the integrated circuit die.

20. The apparatus of claim 19, further comprising a connector coupled to the processor, the connector conforming with one of Universal Serial Bus (USB), High-Definition Multimedia Interface (HDMI) Thunderbolt, Peripheral Component Interconnect Express (PCIe), and Ethernet specifications.

21. The apparatus of claim 19, further comprising an antenna coupled to the processor.

\* \* \* \* \*

UNITED STATES PATENT AND TRADEMARK OFFICE
CERTIFICATE OF CORRECTION

PATENT NO. : 10,972,001 B2
APPLICATION NO. : 16/102203
DATED : April 6, 2021
INVENTOR(S) : Shekhar et al.

Page 1 of 1

It is certified that error appears in the above-identified patent and that said Letters Patent is hereby corrected as shown below:

In the Claims

In Column 13, Line 67, in Claim 1, after "node", insert --,--

In Column 15, Line 4, in Claim 9, after "node", insert --,--

In Column 15, Line 57, in Claim 14, delete "t" and insert --the-- therefor

In Column 16, Line 9, in Claim 15, after "node", insert --,--

In Column 17, Line 13, in Claim 20, after "(HDMI)", insert --,--

Signed and Sealed this
Twenty-first Day of December, 2021

Drew Hirshfeld
*Performing the Functions and Duties of the*
*Under Secretary of Commerce for Intellectual Property and*
*Director of the United States Patent and Trademark Office*